United States Patent [19]

Patel et al.

[11] Patent Number: 5,671,188

[45] Date of Patent: Sep. 23, 1997

[54] RANDOM ACCESS MEMORY HAVING SELECTIVE INTRA-BANK FAST ACTIVATION OF SENSE AMPLIFIERS

[75] Inventors: Vipul C. Patel, San Jose; Chitranjan N. Reddy, Los Altos Hills, both of Calif.

[73] Assignee: Alliance Semiconductor Corporation, San Jose, Calif.

[21] Appl. No.: 670,912

[22] Filed: Jun. 26, 1996

[51] Int. Cl.$^6$ .................................................. G11C 7/00
[52] U.S. Cl. ..................... 365/205; 365/207; 365/230.03
[58] Field of Search ................................. 365/205, 207, 365/208, 149, 230.03; 327/51

[56] References Cited

U.S. PATENT DOCUMENTS

| | | | |
|---|---|---|---|
| 4,608,670 | 8/1986 | Duvvury et al. | 365/205 |
| 4,627,033 | 12/1986 | Hyslop et al. | 365/205 |
| 4,839,868 | 6/1989 | Sato et al. | 365/230.06 |
| 5,127,739 | 7/1992 | Duvvury et al. | 365/189.11 |
| 5,307,317 | 4/1994 | Shiraishi et al. | 365/205 |
| 5,307,321 | 4/1994 | Sasai et al. | 365/230.03 |
| 5,526,314 | 6/1996 | Kumar | 365/207 |
| 5,526,322 | 6/1996 | Lee | 365/233.05 |

*Primary Examiner*—David C. Nelms
*Assistant Examiner*—Hien Nguyen
*Attorney, Agent, or Firm*—Bradley T. Sako

[57] ABSTRACT

A dynamic random access memory (DRAM) (10) is disclosed. Memory cell arrays (12) within the DRAM have word lines and bit lines, the bit lines being logically divided into bit line sections (26a–p). Corresponding to each bit line section (26a–p) is a sense/decode section (28a–p) having a fast and slow sense mode of operation. When data are read from a particular bit line section (26a–p) the corresponding sense decode section (28a–p) operates in the fast sense mode while the remaining sense/decode sections (28a–p) operate in the slow sense mode, providing for lower power consumption and/or faster access speeds.

21 Claims, 6 Drawing Sheets

RANDOM ACCESS MEMORY HAVING SELECTIVE INTRA-BANK FAST ACTIVATION OF SENSE AMPLIFIERS

TECHNICAL FIELD

The present invention relates generally to semiconductor memory devices and more particularly to sensing and decoding circuits for random access memories.

BACKGROUND OF THE INVENTION

Dynamic random access memories (DRAMs) typically include an array of memory cells having word lines and bit lines. When a word line is activated, a row of memory cells is coupled to the bit lines in the array. Once the memory cell data are placed on the bit lines, a bank of sense amplifiers increases the data signals so that the row of cells are refreshed and/or the data can be output to data input/output (I/O) lines. As computer system speeds and memory capacities have increased, the need for faster, larger capacity DRAMs has continued to grow. Increasing capacities and decreasing cell size in DRAMs has introduced some performance constraints, however. An increase in DRAM capacity can result in increased bit line and word line lengths, introducing larger capacitive loads for sense amplifiers and word line drivers. Conversely, shrinking geometries and increasing densities result in smaller device sizes and increased conductor resistance. Concurrent with these constraints is the need to produce a device that is both fast (in data read and write operations) and has minimal power consumption.

Device speed can be increased by improving the speed at which memory cell data signals are sensed. Sensing speeds can be improved by driving bit lines with larger sense amplifier devices. Such approaches must be undertaken carefully, however, as the relatively small size of high density memory cells produces a correspondingly small data signal when the cells are coupled to the bit lines. Because larger devices can be noisy, the bit lines can be driven ("split") in the opposite direction of the cell data signal, resulting in an incorrect reading of data and/or a resulting incorrect refresh of the cell. In addition, large devices can consume more power, force higher peak currents (as entire banks of sense amplifiers are usually activated simultaneously), and also result in larger die sizes.

It is known in the prior art to provide a DRAM having a number of arrays, in which the sense amplifier banks for only selected arrays are activated on any given data access cycle.

U.S. Pat. No. 4,627,033 issued to Hyslop et al. on Dec. 2, 1986 discloses a DRAM having CMOS sense amplifiers wherein, in a given operating cycle, one half of sense amplifiers in row are undergo a slow, low current refresh operation, while the other half of the sense amplifiers undergo a fast, higher current, two step sense operation. A drawback to the Hyslop et al. approach is that with larger densities; simultaneously activating one half of the cells can still result in unacceptably high peak currents.

It would be desirable to provide a high density DRAM having fast access speeds, lower power consumption, and a smaller peak current requirement than prior art approaches.

SUMMARY OF THE INVENTION

It is an object of the present invention to provide a high density DRAM having a fast data sense speed.

It is another object of the present invention to provide a high density DRAM having a low peak current requirement.

According to the present invention, the bit lines of a DRAM array are logically divided according to a portion of the column address into bit line sections. Each bit line section is coupled to a corresponding section of sense circuits. Each sense circuit section can be activated in fast sense mode and a slow sense mode. In a data access operation, one or more bit lines within a selected bit line section are coupled to I/O lines according to a column address. The sense circuit section corresponding to the selected bit line section is driven in the fast sense mode, while the remaining sense circuit sections are driven in the slow sense mode.

Further according to the present invention, the word lines of a DRAM array include a number of primary word line segments, with the primary word line segments of the same row being commonly driven by a secondary word line. The interconnection between the secondary word lines and primary word line segments are commonly aligned and displace the bit lines, resulting in a bit line gap. Sense circuit sections are aligned with primary word line segments on the edge of the array, and sense circuit section decoders, for driving a selected sense circuit section in the fast sense mode, are aligned with the bit line gaps between sense circuit sections.

Further according to the present invention, each sense circuit includes a first, large power supply coupling transistor and a second, smaller power supply coupling transistor. The sense circuit sections are driven in a fast sense mode by activating both the first and second power supply coupling transistors of their respective sense amplifiers.

Further according to the present invention, each sense circuit includes an additional latch circuit. The sense circuit sections are driven in a fast sense mode by activating the additional latch circuit therein.

An advantage of the present invention is that it provides a high density DRAM having a fast data sense speed with a compact layout.

Other objects and advantages of the present invention will become apparent in light of the following description thereof.

DETAILED DESCRIPTION OF THE EMBODIMENTS

Figure 1:
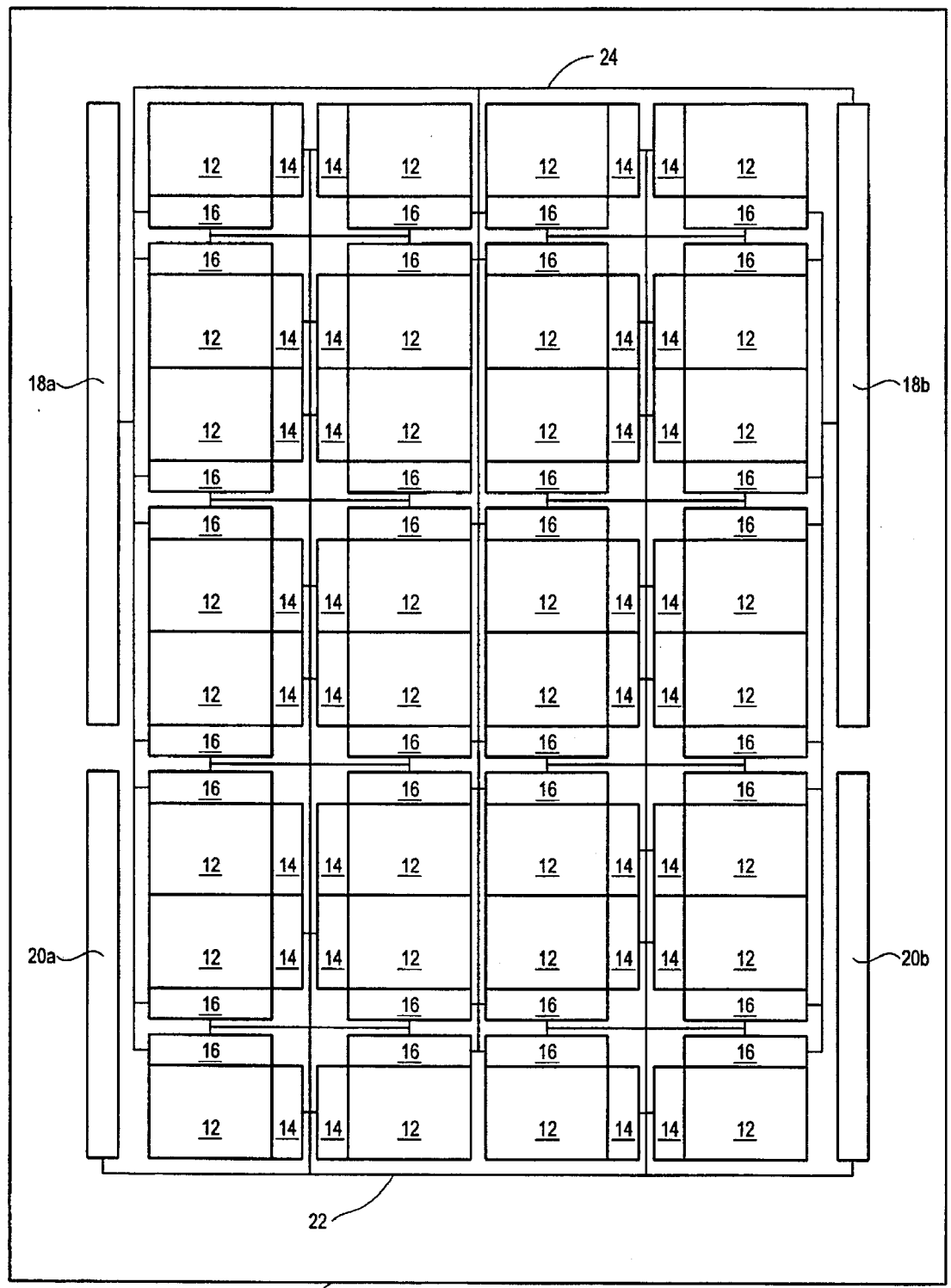
FIG. 1 is a block diagram illustrating a dynamic RAM according to the present invention.

FIG. 1 sets forth, generally, a dynamic random access memory (DRAM) according to a preferred embodiment of the present invention. The DRAM is designated by the general reference character 10 and is shown to include a plurality of memory cell arrays 12, each having an associated row decoding circuit 14 and column sense/decode circuit 16. Data input/output (I/O) circuits 18a–b and address buffer/decoder circuits 20a–b are shown disposed on the periphery of the DRAM 10.

According to well understood techniques, in a data access operation the DRAM 10 receives timing control signals on timing control inputs (not shown) and a multiplexed row and column address on the address buffer/decoder circuits 20. The address buffer/decoder circuits 20 receive the row address and generate a number of pre-decoded row address signals which are coupled along address lines 22 to the row decoding circuits 14. Similarly, in response to the column address a number of column predecode signals are generated and coupled to the column sense/decode circuits 16. Timing control signals in combination with the row decoding circuit 14 drive word lines in selected arrays 12 and couple a row of memory cells to the bit lines of the selected arrays 12. In the event the data access operation is a read operation, the data signals on the bit lines are sensed (amplified), refreshing the cell data, and selected bit lines are coupled to the data I/O circuits 18 by way of the data I/O lines 24. In a write operation, data are received, placed on the data I/O lines 24, and then coupled to the selected memory cells by the operation of the column sense/decode circuits 16 and the row decoding circuits 14. In the particular embodiment set forth in FIG. 1, each row decoding circuit 14 drives word lines in two arrays (a "left" array and a "right" array). Similarly, each column sense/decode circuit 16 is coupled to two arrays (a "top" and a "bottom" array).

Figure 2:
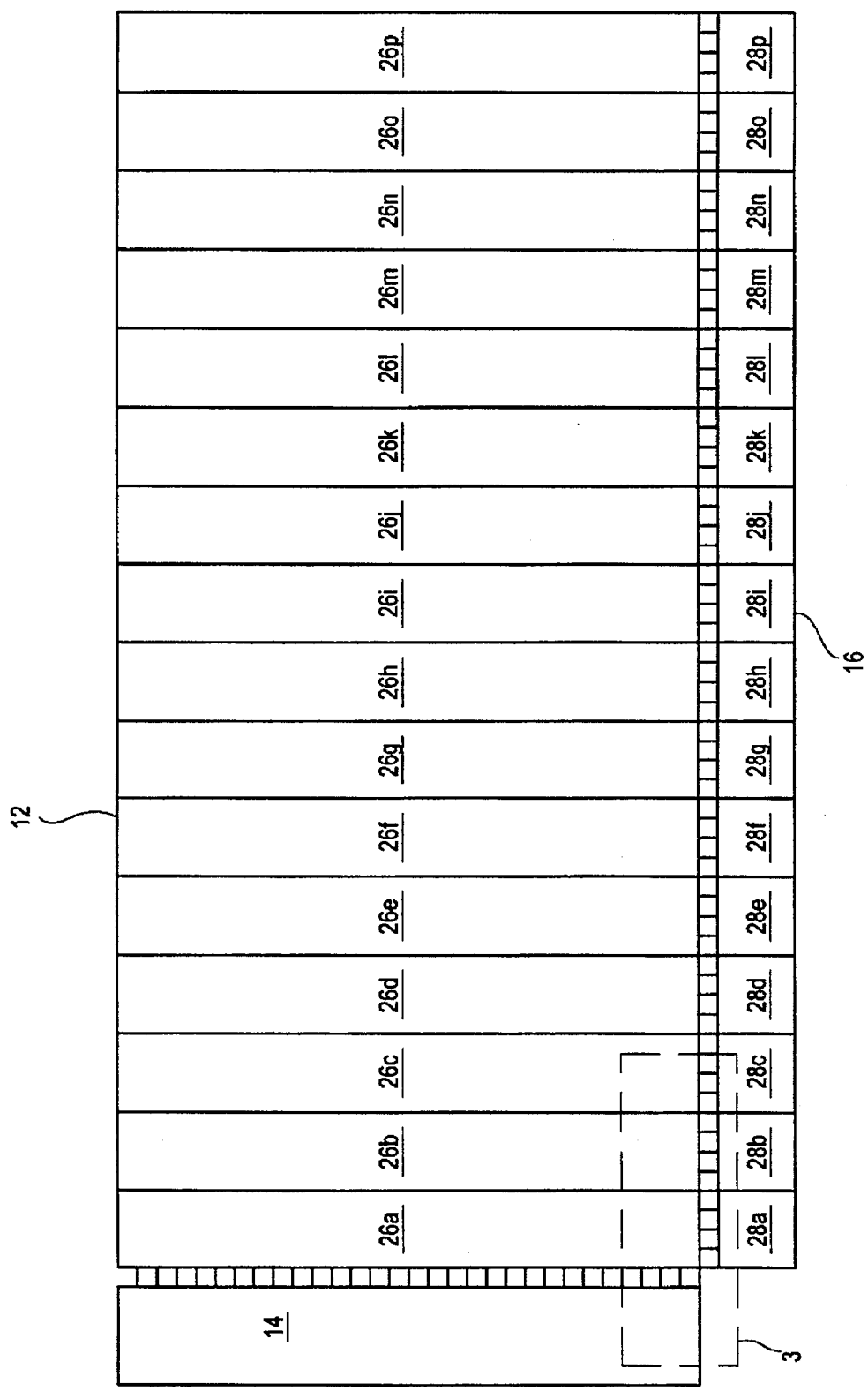
FIG. 2 is block diagram illustrating a dynamic RAM array according to one embodiment of the present invention.

Referring now to FIG. 2, one array 12 of the DRAM 10 is set forth in more detail. In the particular embodiment described, the array 12 is arranged with 256 rows and 512 columns and is of a "folded" bit line design. Accordingly, there is a bit line pair corresponding to each column and a word line corresponding to each row. The particular word line structure of the preferred embodiment will be discussed in more detail below. The array 12 in FIG. 2 is arranged in a number of vertical sections referred to herein as bit line sections. The array 12 begins with a first bit line section 26a and ends with a sixteenth bit line section 26p. The bit line sections 26a–p represent a logical division, according to column address, of the bit lines in the array 12. Each bit line section 26a–p includes 32 bit line pairs.

Also set forth in FIG. 2 is the row decoding circuit 14 and the column sense/decode circuit 16 associated with the array 12. The row decoding circuit 14 of the preferred embodiment is conventional in nature and so will not be discussed in any further detail. The column sense/decode circuit 16, like the bit lines of array 12, is divided into 16 sense/decode sections 28a–p, each corresponding to a bit line section 26a–p. A more detailed description of the column sense/decode circuit 16 of the preferred embodiment follows below.

Figure 3:
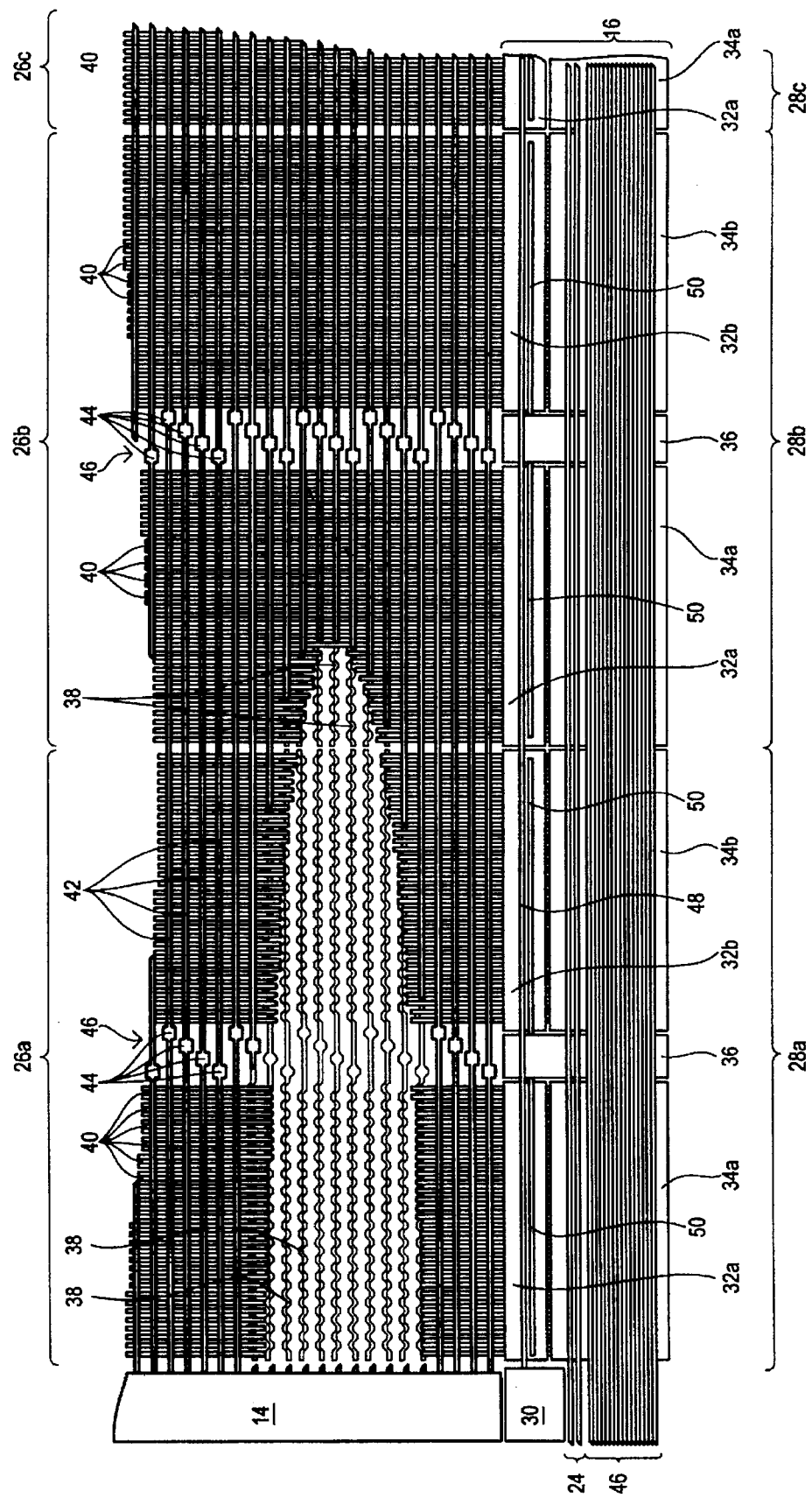
FIG. 3 is a cut away top plan view of a portion of the array set forth in FIG. 2.

Referring now to FIG. 3, a portion of the array 12 (identified in FIG. 2 by the reference character "3") is shown in a partially cut-away top plan view. Set forth in FIG. 3 are a portion of three bit line sections 26a–c, a portion of the row decoder circuit 14, and a portion of the column sense/decode circuit 16. The portion of the column sense decode circuit 16 displayed includes sense/decode sections 28a–c which correspond to the bit line sections 26a–c, respectively. Each sense/decode section 28a–c includes a left and right sense circuit block 32a–b, a left and right column decode block 34a–b, and a section sense clock circuit 36. An array sense clock circuit 30 is disposed below the row decoding circuit 14.

In the particular embodiment of FIG. 3, the bit lines and word lines of the array 12 are fabricated utilizing three conductive layers. The first conductive layer is used to pattern a number of primary word line segments 38. Each row of the array 12 includes a number of successive primary word line segments 38 which span the array 12. The primary word line segments 38 are isolated from one another and connect a group of memory cells from within the row to bit line pairs 40 in the array 12. In the particular example of FIG. 3, each primary word line segment 38 corresponds to a particular bit line section 26 and couples 32 cells in its associated row to the 32 bit line pairs 40 of its associated bit line section 26. The bit line pairs 40 are fabricated from the second conductive layer. The primary word line segments 38 within the same array row are commonly connected to one secondary word line 42 fabricated from a third conductive layer. The secondary word lines 42 are driven by the row decoder circuit 14 and span substantially all of the array 12. Connection between the secondary word lines 42 and their associated primary word line segments 38 is accomplished by vertical interconnects 44. In the preferred embodiment, the primary word line segments 38 are fabricated from doped polysilicon, while the bit line pairs 40 and secondary word lines 42 are fabricated from subsequent metallization layers.

Referring once again to FIG. 3, the vertical interconnects 44 are shown to be staggered across the array rows in groups of four. Further, the staggered groups of four are aligned in the directions of the bit line pairs 40. Because the vertical interconnects 44 extend between the first conductive layer and the third conductive layer, there are no bit line pairs 40 (as they are constructed from the second conductive layer) below the vertical interconnects 44. This results in a bit line "gap" 46 within each bit line section 26.

Situated on the bottom portion of FIG. 3 are a number of column pre-decode lines 46. The column pre-decode lines 46 couple column pre-decode signals to each column decode block 34. In response to the column pre-decode signals, one of the column decode blocks 34a–b couples bit line pairs 40 to the data I/O lines 24. One or more of the column predecode signals determines from which column decode block 34a–b data will be read from or written to. This arrangement results in the logical division of the bit lines into bit line sections 26a–p, previously described. The particular decoding circuits of the preferred embodiment will be discussed in more detail below.

Situated at one end of the column sense/decode circuit 16 is the array sense clock circuit 30. The array sense clock circuit 30 generates a global sense control signal (SA1) in response to a first timing signal (CLK1) provided by a sense timing circuit (not shown). In the preferred embodiment the sense timing circuit is responsive to externally applied row and column address strobe signals (RAS and CAS, respectively). Sense timing circuits are well understood in the art, and so will not be discussed in any further detail herein. The SA1 signal is driven by the sense clock circuit 30 and coupled by a first sense line 48 that extends across substantially the entire array 12, simultaneously activating all of the sense circuit blocks 32a–b of the array 12 in a given memory access operation. Thus, after a row of memory cells are coupled to the bit line pairs 40 by the activation of a word line 42, the SA1 signal is activated and the cell data are sensed/refreshed, with selected cells being read from, or written to, as the case may be.

Situated between each sense circuit block 32a and 32b, aligned with the corresponding bit line gap 46, is a section sense driver circuit 36. Each section sense driver circuit 36 couples a local section sense node (SNODE) to a power supply voltage in response to the global sense control signal (SA1) and/or a local sense control signal (SA2). The SA2 signal is generated from a second timing signal (CLK2) and one or more of the column pre-decode signals provided by lines 46. Because the SA2 signal is activated in response to decoder signals, in the embodiment of FIG. 3, each SA2 signal is particular to its associated sense/decode section 28.

Referring once again to FIG. 3, the local SNODE is distributed by node lines 50 which extend from the section sense driver circuit 36 in one direction across the first sense circuit block 32a, and in the opposing direction across the second sense circuit block 32b. In the preferred embodiment, sense operation of a sense circuit block 32 is faster when the both the SA1 signal and the SA2 signals are active. In this manner, when a memory column address selects a memory cell from a particular column, the entire bit line section 26a–p containing the selected column is driven by the sense circuit blocks 32a–b associated with the section 26a–p in a fast operation mode, resulting in rapid read access times.

Figure 4:
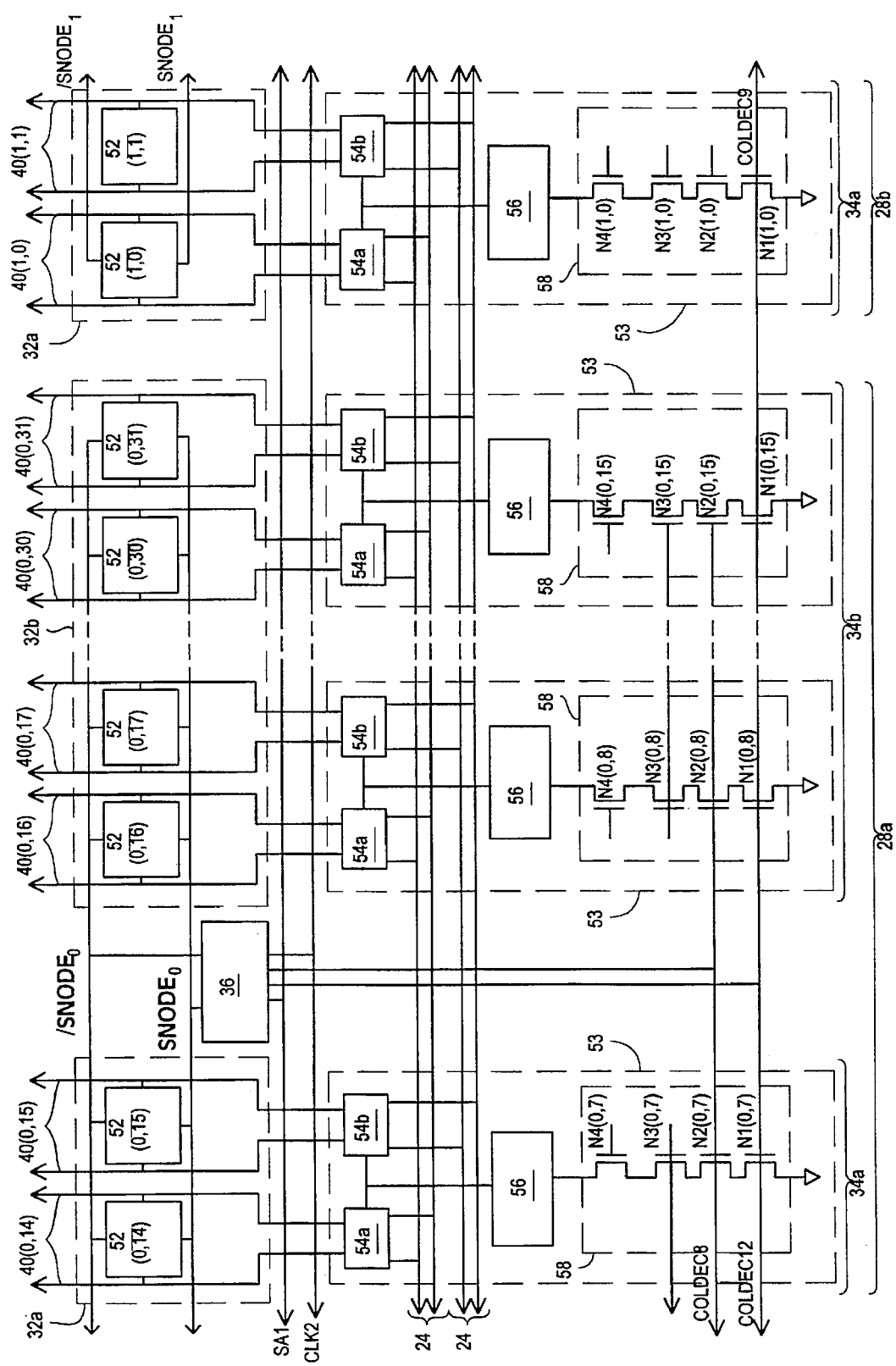
FIG. 4 is a schematic diagram illustrating the sense and decoding circuit according to one embodiment of the present invention.

Referring now to FIG. 4, a portion of sense decode sections 28a and 28b, according to a preferred embodiment, are set forth in a block schematic diagram. FIG. 4 illustrates eight selected bit line pairs 40 as well as the sense and decoding circuits associated therewith. The bit lines pairs 40 are designated by two numbers (I, J) that represent the position of the bit line pair 40 within the array 12. The first number, I, indicates a particular bit line section 26a–p within the array 12. As illustrated in FIG. 2, the preferred embodiment includes sixteen bit line sections 26a–p, and so I may have a value from 0–15. The second number, J, indicates a particular bit line pair 40 within the bit line section 26a–p. As illustrated in FIG. 3, in the preferred embodiment there are 32 bit line pairs 40 within each bit line section 26a–p. Thus, J has a range from 0 and 31.

The sense circuits blocks 32 are shown to include a sense amplifier 52 corresponding to each bit line pair 40. Each sense amplifier 52 in FIG. 4 is designated by the same two numbers (I, J) as its corresponding bit line pair 40. Accordingly, sense amplifiers 52(0,14) and 52(0,15) are the last two sense amplifiers in the first left sense circuit block 32a; sense amplifiers 52(0,16) and 52(0,17) are the first two sense amplifiers in the first right sense circuit block 32b; sense amplifiers 52(0,30) and 52(0,31) are the last two sense amplifiers in the first right sense circuit block 32b; and sense amplifiers 52(1,0) and 52(1,1) are the first two sense amplifiers in the second left sense circuit block 32a. The sense amplifiers 52 are coupled between their respective bit line pairs 40 and are activated when the local node SNODE, is coupled to a reference voltage. In the particular embodiment of FIG. 4, each sense amplifier 52 is coupled to a first local node SNODE and a second complementary local node /SNODE. Both SNODE and /SNODE are coupled to power supply voltages by the operation of the section sense driver circuit 36.

Referring once again to FIG. 4, it is shown that the column decode blocks 34a–b include a number of column decode circuits 53, each corresponding to two consecutive bit line pairs 40. Each column decode circuit includes a passgate pair 54a–b, a passgate driver 56, and a select circuit 58. The passgates 54a–b each couple two bit line pairs 40 to two data I/O line pairs 24. The passgate pairs 54a–b are commonly driven by the associated passgate driver 56. The passgate driver 56, in turn, is activated by the select circuit 58 going to a logic low level. The select circuit 58 is shown to be of conventional design, and includes four n-channel MOS transistors (N1–N4) connected in series between the passgate driver 56 and ground. The decoding transistors (N1–N4) are further designated by their position in the column decode block 34 in a similar fashion to the bit line pairs 40 and sense amplifiers 52, the difference being that there are only sixteen select circuits 58 associated with each sense/decode section 28a–p.

The first decoding transistors (N1) of each decoder circuit 56 receives one of a first group of four high level column pre-decoding signals. The high level pre-decoding signal selects 128 of the 512 columns in the array 12. Each column decode circuit 53 in FIG. 4 is coupled to the same decoded group of 128 columns, and so each of the first decoding transistors N1 (0,7), N1 (0,8), N1 (0,15) and N1 (1,0) receives the same column pre-decode signal COLDEC 12. The second decoding transistor (N2) receives one of a second group of four column pre-decode signals, corresponding to the selection of a group of thirty-two columns from the selected group of 128 columns determined by N1. In the preferred embodiment, the combination of N1 and N2 results in the logical division of the array into the bit line and sense/decode sections (26a–p and 28a–p). In FIG. 4, the second decoding transistors of the first sense/decode section 28a (N2 (0,7), N2 (0,8) and N2 (0,15)) each receive the same column pre-decode signal COLDEC 8. In contrast, the second transistors of the second sense/decode sections 28b (N2 (1,0)) receive a different section decode signal COLDEC 9. The third and fourth column decoding transistors (N3 and N4) select two columns from the selected section of 32 columns.

Referring yet again to FIG. 4, the section sense driver circuit 36 for the first sense/decode section 28a is shown to receive as inputs, the global SA1 signal, the CLK2 signal and the column pre-decode signals COLDEC 8 and COLDEC 12. In response to these inputs, the sense driver circuit 36 couples SNODE and/or /SNODE to a power supply voltage. It is noted that there are two local section sense nodes and complementary nodes illustrated in FIG. 4; $SNODE_0$, $SNODE_1$, $/SNODE_0$ and $/SNODE_1$. $SNODE_0$ and $/SNODE_0$ are common to each sense amplifier 52 of the first sense decode section 28a and so are shown in FIG. 4 coupled to sense amplifiers 51(0,14), 52(0,15), 52(0,16), 52(0,17), 52(0,30) and 52(0,31). $SNODE_1$ and $/SNODE_1$ on the other hand, are common to each sense amplifier in the second decode section 28a, and so are shown in FIG. 4 coupled to sense amplifiers 52(1,0) and 52(1,1). It is understood that in the preferred embodiment, $SNODE_1$ and $/SNODE_1$ are coupled to a power supply voltages by another section sense clock circuit (not shown in FIG. 4) that receives the CLK2 signal and column pre-decode signals COLDEC 9 and COLDEC 12 as inputs.

Figure 5A:
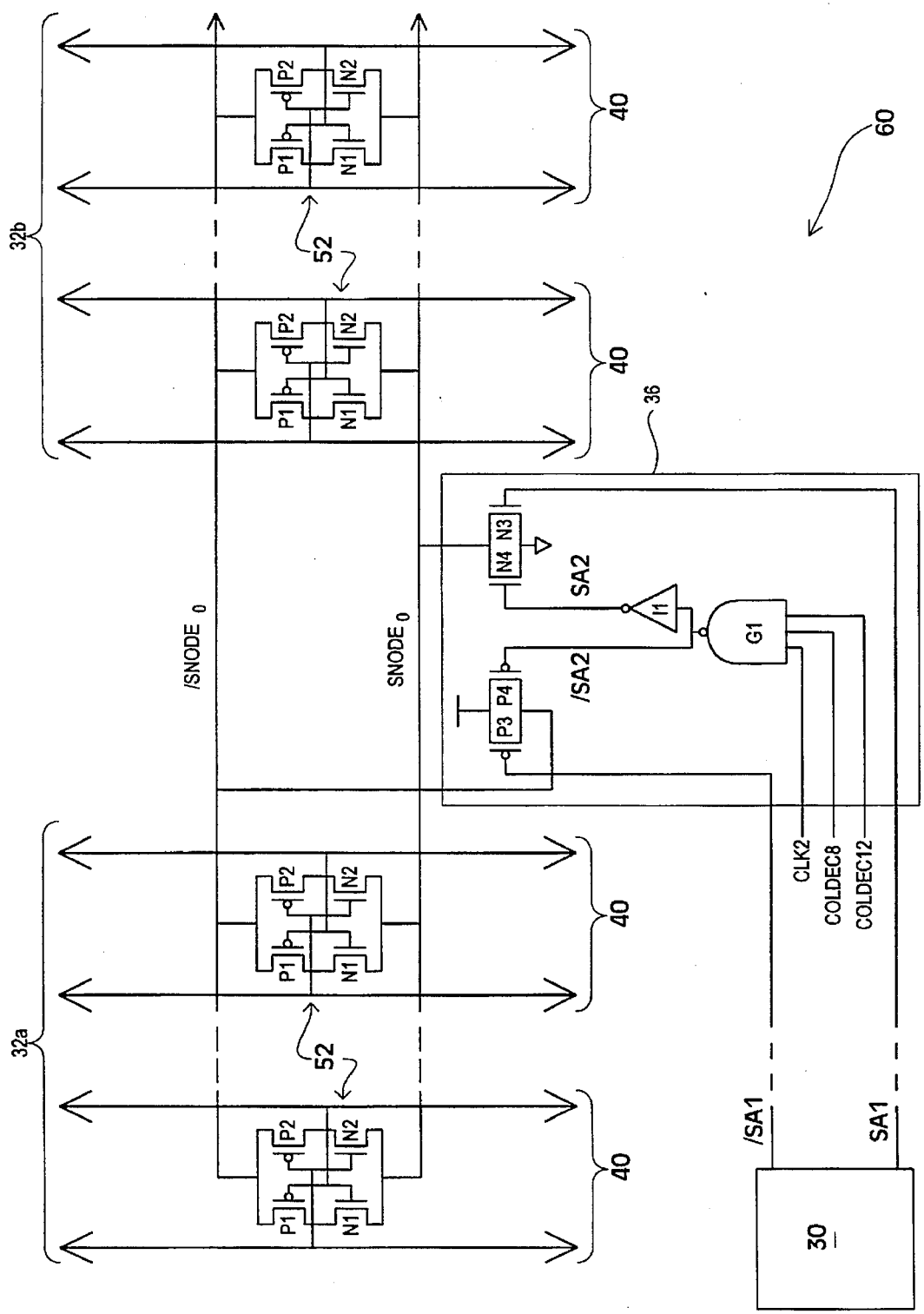
FIGS. 5a and 5b are schematic diagrams illustrating sense amplifier circuits having a fast and slow sense mode of operation.
Figure 5B:
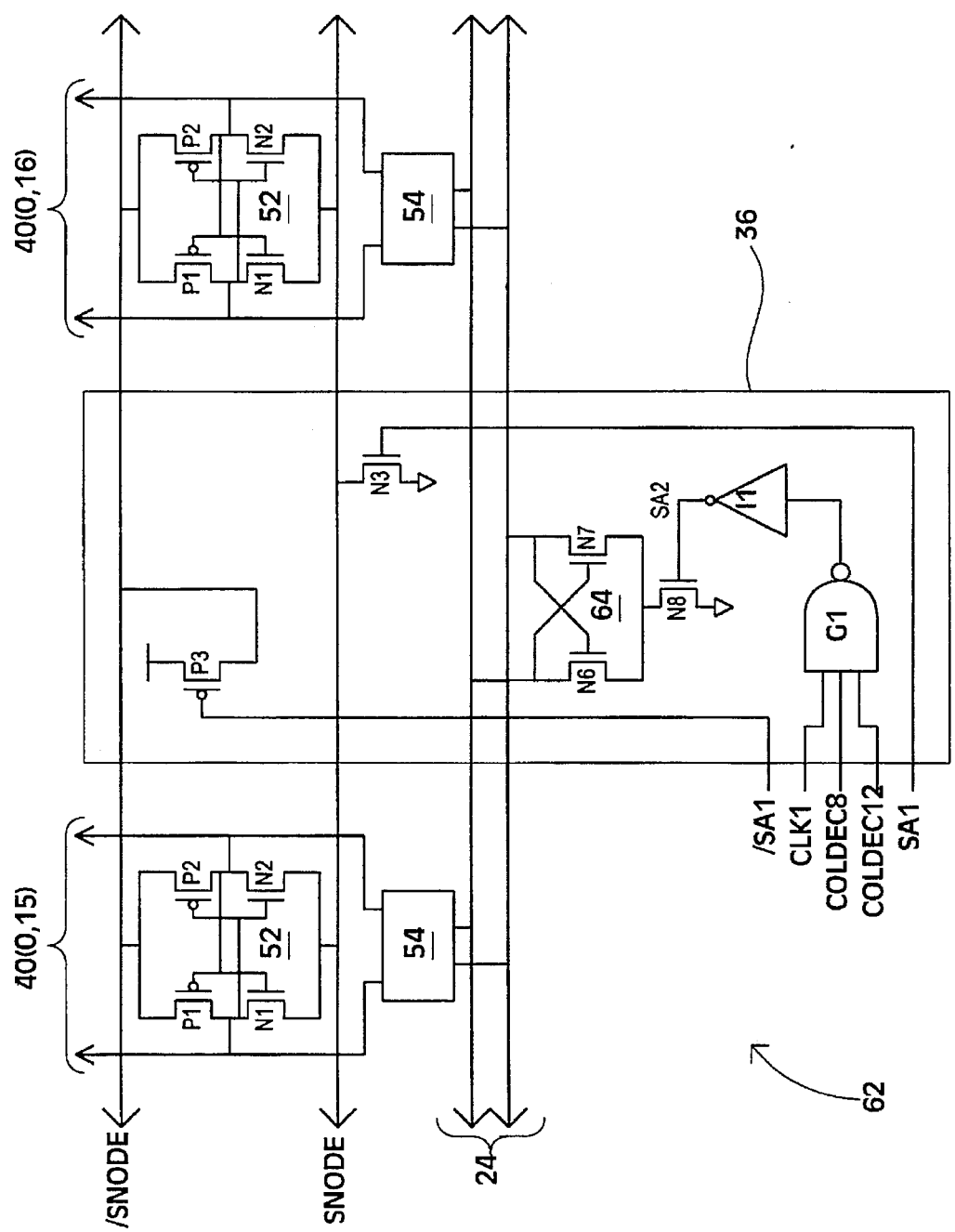

Referring now to FIGS. 5a and 5b, two examples of sense amplifiers arrangements having a "fast" and "slow" sense mode are set forth in detail. Both sense amplifier arrangements are placed in the slow sense mode by the activation of the SA1 signal, and placed in the fast sense mode by the simultaneous activation of both the SA1 and the SA2 signals.

Referring now to FIG. 5a a sense amplifier arrangement is designated by the general reference character 60 and includes a number of sense amplifiers 52. Each sense amplifier 52 includes a cross coupled pair of n-channel MOS (NMOS) devices (N1-2) and a cross coupled pair of p-channel MOS (PMOS) devices (P1-2). The cross-coupled nodes of each sense amplifier 52 are coupled between bit line pairs 40. Each sense amplifier 52 is enabled by coupling the common node of its PMOS pair to the positive power supply and/or coupling the common node of its NMOS pair to the opposite power supply (ground in the case of FIG. 5a). The common nodes of NMOS pairs are coupled to ground by way of $SNODE_0$. Correspondingly, in a preferred embodiment, the common node of the PMOS pairs are coupled to the positive power supply by way of complementary node /SNODE$_0$.

Node SNODE$_0$ and its corresponding complementary nodes /SNODE$_0$ are driven according to the operation of the array sense clock circuit 30 and the section sense driver circuit 36. In the embodiment of FIG. 5a, the array sense clock circuit 30 provides the first sense clock SA1 and its complement /SA1. SA1 and /SA1 enable section pull-down transistor (N3) and section pull-up transistor (P3), which are both situated within the section sense driver circuit 36. In the embodiment of FIG. 5a, the section sense driver circuit 36 also includes a second pull-down transistor (N4) and a second pull-up transistor (P4). N4 and P4 are driven by a section sense clock SA2 and its complement /SA2. In the particular section sense driver circuit shown in FIG. 5a, SA2 and /SA2 are generated by a three input NAND gate (G1) and an inverter (I1). When CLK2, COLDEC8 and COLDEC12 are all active, SA2 goes high, enabling N4, and /SA2 goes low, enabling P4. It is noted that transistors N3 and P3 are smaller than transistor N4 and P4, providing a slower sensing speed. In a preferred embodiment, during a sense cycle, SA2 is active before SA1 turning on the relatively large devices N4 and P4 in a selected sense section 28 for a fast sense cycle. In the remaining sense sections 28 (i.e., those with inactive SA2 signals) refresh is accomplished by the subsequent global activation of the smaller devices N3 and P3 by the SA1 signal.

Referring now to FIG. 5b, a second sense amplifier arrangement is designated by the reference character 62. The sense amplifier arrangement 62 is similar to that of FIG. 5a in that it includes sense amplifiers 52 having a cross coupled pair of NMOS devices (N1-2) and a cross coupled pair of PMOS devices (P1-2) having common nodes coupled to local nodes SNODE and /SNODE, respectively. As in the case of FIG. 5a, a relatively small pull-down (N3) and pull-up (P3) device are provided for driving the SNODE and /SNODE in response to the first sense clock SA1 and its complement /SA1. Unlike the arrangement of FIG. 5a, the section sense decoder circuit 36 also includes a latch circuit 64. The additional latch circuit 64 includes a cross-coupled pair of NMOS devices (N6-7) that are activated by a latch pull-down transistor N8. The gate of the latch pull-down transistor N8 is activated by a section sense clock signal shown as SA2. It is noted that the SA2 signal is activated by the combination of the COLDEC8 and COLDEC12 signals in combination with the CLK2 signal (i.e., no CLK2 signal is required). As a result, SA1 and SA2 are activated in a substantially simultaneous manner. Further, the latch circuit 64 is coupled to data I/O lines 24. Thus, in the embodiment of FIG. 5b, the sense speed is increased by latching the signal on a section dependent I/O line pair, rather than driving a section dependent sense amplifier power supply node.

While two particular sense amplifier circuits compatible with the present invention have been illustrated, it is understood that other such circuits could be incorporated by the present invention. It is particularly noted that the large, section dependent devices pull-up or pull-down devices could be placed with increasing frequency within a sense/decode section. The present invention is not limited to DRAM devices, and is applicable to other memory and logic devices where selective fast sensing, lower power consumption, and reduction in peak sense current is desired. Accordingly, it is understood that the embodiments set forth herein are only some of the possible embodiments of the present invention, and that the invention may be changed, and other embodiments derived, without departing from the spirit and scope of the invention, the present invention intending to be limited only by the appended claims.

What we claim is:

1. In a random access memory having at least one array of memory cells, wherein a particular row of memory cells is coupled to a plurality of bit lines by activating selected word lines, a data sensing circuit, comprising:

an array of sense amplifiers coupled to the bit lines for receiving memory cell data from the particular row of memory cells;

each sense amplifier of said array of sense amplifiers being operable in a first mode in response to a first mode signal and a second mode in response to a second mode signal;

sense amplifier decoding means for generating a first mode signal for a portion of the sense amplifier array in response to a first timing signal and at least a first decoding signal; and the first decoding signal is generated in response to at least one memory address input signal.

2. The data sensing circuit of claim 1, wherein:

the first mode of each said sense amplifier is a fast sense mode and the second mode is a slow sense mode.

3. The data sensing circuit of claim 2, wherein:

each said sense amplifier is operable in the slow sense mode by coupling a power node to a first power supply by at least a first activating device, and is operable in the fast sense mode by coupling the power supply node to the first power supply by at least a second activating device.

4. The data sensing circuit of claim 3, wherein:

said first power supply is a low power supply.

5. The data sensing circuit of claim 3, wherein:

said first power supply is a high power supply.

6. The data sensing circuit of claim 2, wherein:

the second mode signal is subsequent to the first mode signal.

7. The data sensing circuit of claim 1, including:

a column decoder circuit for coupling the output of at least one selected sense amplifier to a data input/output (I/O) line in response to a combination of memory address input signals; and the decoding signal is generated from at least one of the memory address input signals such that the selected sense amplifier output is within the portion of said sense amplifier array receiving the first mode sense signal.

8. The data sensing circuit of claim 1, including:

said array of sense amplifiers includes a plurality of sense amplifier sections, each sense amplifier section being coupled to a consecutive group of bit lines; and said sense amplifier decoding means is intermediate adjacent sense amplifier sections.

9. The data sensing circuit of claim 1, including:

the array includes at least one side;

the bit lines of the array include a plurality of bit line gaps; and said sense amplifier decoding means includes a plurality of sense decoding sections disposed adjacent to the bit line gaps on the side of the array.

10. A random access memory, comprising:

an array of memory cells;

means for coupling memory cell data from said array of memory cells to a plurality of bit line outputs;

amplifying means for providing a first amplification of the cell data on the bit line outputs;

first decoding means for coupling a decoded bit line output to a data output in response to a first part of an externally applied address signal; and boost means for providing a second amplification of selected bit line outputs in response to at least a portion of the first part of the externally applied address signal, the decoded bit line output being one of the selected bit line outputs.

11. The random access memory of claim 10, wherein:

said array of memory cells includes a plurality of memory cell rows; and said means for coupling memory cell data includes a row decoding means for receiving a second portion of the externally applied address signal and coupling a row of memory cells to the plurality of bit line outputs.

12. The random access memory of claim 10, wherein:

said means for coupling memory cell data includes a plurality of word line segments for each memory cell row, the word line segments coupling a group of memory cell data to a corresponding segment of bit lines.

13. The random access memory of claim 12, wherein:

said amplifying means includes a plurality of amplifying segments corresponding to each segment of bit lines; and said boost means provides the second amplification to at least one selected segment of bit lines.

14. The random access memory of claim 10, wherein:

said array of memory cells includes a plurality of bit lines;

said means for coupling memory cell data includes a plurality of word line segments corresponding to each row of memory cells in said array, the word line segments of like rows being commonly coupled to array word lines by vertical interconnects, the vertical interconnects displacing the bit lines and being aligned in the bit line direction resulting in bit line groups separated by bit line gaps;

said amplifying means includes a plurality of sense banks, each sense bank being disposed opposite to a bit line group; and said boost means includes a plurality of boost decoding means for generating a boost signal corresponding to the selected bit line outputs, the boost decoding means being disposed opposite to the bit line gaps.

15. The random access memory of claim 11, wherein:

said boost means provides the second amplification by increasing the current supplied to said amplifying means.

16. The random access memory of claim 11, wherein:

said first decoding means includes at least one data output; and said boost means includes a latch coupled to the at least one data output, the latch being activated in response to at least a portion of the first part of the externally applied address signal.

17. A random access memory, comprising:

at least one array including a plurality of memory cells disposed in rows and columns, each row of cells including a plurality of primary word line segments formed from a first conductive layer, a plurality of secondary word lines formed from a second conductive layer, each secondary word line being coupled to the word line segments of a memory cell row by vertical interconnects;

a plurality of bit lines formed from a third conductive layer disposed generally perpendicular to the primary word line segments;

a plurality of sense amplifiers coupled to said plurality of bit lines, each sense amplifier having at least one activation node;

at least one array sense enable device coupled to the sense nodes of said plurality of sense amplifiers;

an array sense circuit for enabling said plurality of sense enable devices in response to an array clock signal;

a plurality of section sense enable devices coupled to the sense nodes of said plurality of sense amplifiers; and a section sense circuit for enabling selected section sense enable devices in response to a section clock signal and a plurality of decoding signals.

18. The random access memory of claim 17, wherein:

said array includes, the primary word line segments being generally disposed in a first direction, the vertical interconnects coupling the secondary word lines to the primary word line segments form at least one generally compact group disposed in a second direction generally perpendicular to the first, and the bit lines are disposed in the second direction and are displaced by the vertical interconnects resulting in at least one bit line gap disposed in the second direction.

19. The random access memory of claim 18, wherein:

said array includes a column edge disposed generally in the first direction; and said plurality of section sense enable devices are adjacent to the column edge and generally aligned in the second direction with the at least one bit line gap.

20. The random access memory of claim 18, including:

said array includes a column edge disposed generally in the first direction; and a plurality of column decoder sections disposed adjacent to the column edge, each column decoder section coupling the output of one of said sense amplifiers to at least one input/output (I/O) line.

21. The random access memory of claim 20, wherein:

said sense amplifier decoding circuit is disposed adjacent to the column edge of said array between column decoder sections.

* * * * *

(12) EX PARTE REEXAMINATION CERTIFICATE (10430th)

United States Patent
Patel et al.

(10) Number: US 5,671,188 C1
(45) Certificate Issued: Dec. 12, 2014

(54) RANDOM ACCESS MEMORY HAVING SELECTIVE INTRA-BANK FAST ACTIVATION OF SENSE AMPLIFIERS

(75) Inventors: Vipul C. Patel, San Jose, CA (US); Chitranjan N. Reddy, Los Altos Hills, CA (US)

(73) Assignee: Advanced Data Access LLC, Frisco, TX (US)

Reexamination Request:
No. 90/012,076, Jan. 5, 2012

Reexamination Certificate for:
Patent No.: 5,671,188
Issued: Sep. 23, 1997
Appl. No.: 08/670,912
Filed: Jun. 26, 1996

(51) Int. Cl.
*G11C 7/00* (2006.01)
*G11C 11/4097* (2006.01)
*G11C 7/18* (2006.01)
*G11C 11/4091* (2006.01)
*G11C 11/409* (2006.01)

(52) U.S. Cl.
USPC ........................ 365/205; 365/207; 365/230.03

(58) Field of Classification Search
None
See application file for complete search history.

(56) References Cited

To view the complete listing of prior art documents cited during the proceeding for Reexamination Control Number 90/012,076, please refer to the USPTO's public Patent Application Information Retrieval (PAIR) system under the Display References tab.

*Primary Examiner* — Majid A. Banankhah

(57) ABSTRACT

A dynamic random access memory (DRAM) (10) is disclosed. Memory cell arrays (12) within the DRAM have word lines and bit lines, the bit lines being logically divided into bit line sections (26a-p). Corresponding to each bit line section (26a-p) is a sense/decode section (28a-p) having a fast and slow sense mode of operation. When data are read from a particular bit line section (26a-p) the corresponding sense decode section (28a-p) operates in the fast sense mode while the remaining sense/decode sections (28a-p) operate in the slow sense mode, providing for lower power consumption and/or faster access speeds.

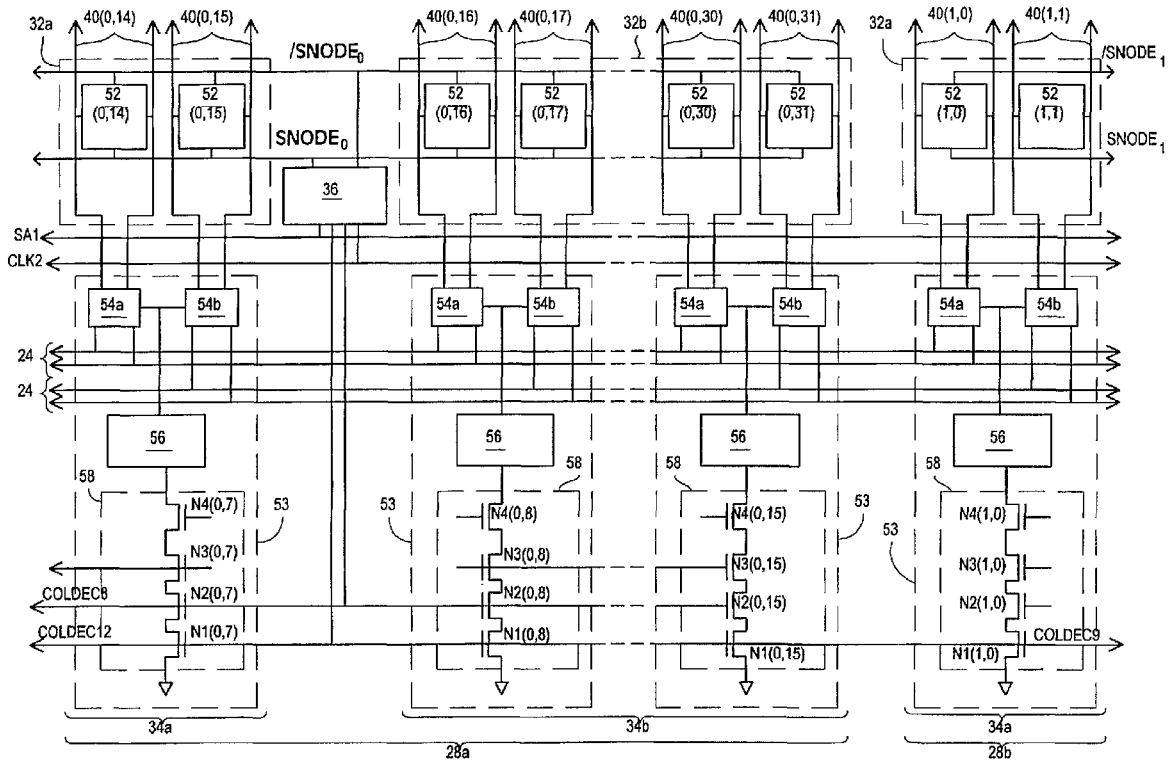

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

The patentability of claims 10 and 17 is confirmed.

Claim 1 is cancelled.

Claims 2-9, 11-16 and 18-21 were not reexamined.

* * * * *